(12) United States Patent
Jeong et al.

(10) Patent No.: US 8,040,733 B2
(45) Date of Patent: Oct. 18, 2011

(54) NON-VOLATILE MEMORY DEVICE AND METHOD OF OPERATING THE SAME

(75) Inventors: Jae-hun Jeong, Hwaseong-si (KR); Soon-moon Jung, Seongnam-si (KR); Han-soo Kim, Suwon-si (KR); Jae-hoon Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 216 days.

(21) Appl. No.: 12/486,924

(22) Filed: Jun. 18, 2009

(65) Prior Publication Data

US 2010/0046294 A1    Feb. 25, 2010

(30) Foreign Application Priority Data

Aug. 25, 2008   (KR) .................. 10-2008-0083025

(51) Int. Cl.
*G11C 11/34*     (2006.01)
*G11C 16/04*     (2006.01)
*G11C 16/06*     (2006.01)

(52) U.S. Cl. ........... 365/185.2; 365/185.17; 365/185.23; 365/185.28

(58) Field of Classification Search ................ 365/185.2
See application file for complete search history.

(56) References Cited

U.S. PATENT DOCUMENTS

| 7,652,926 | B2* | 1/2010 | Kang et al. | 365/185.2 |
| 7,830,724 | B2* | 11/2010 | Park et al. | 365/185.29 |
| 7,839,694 | B2* | 11/2010 | Joe et al. | 365/185.23 |
| 2006/0139997 | A1* | 6/2006 | Park et al. | 365/185.2 |
| 2006/0239077 | A1* | 10/2006 | Park et al. | 365/185.17 |
| 2007/0171728 | A1* | 7/2007 | Cho | 365/185.29 |
| 2008/0144378 | A1* | 6/2008 | Park et al. | 365/185.05 |
| 2008/0304326 | A1* | 12/2008 | Kim et al. | 365/185.22 |
| 2009/0003067 | A1* | 1/2009 | Kang et al. | 365/185.13 |
| 2010/0046290 | A1* | 2/2010 | Park et al. | 365/185.2 |
| 2010/0054036 | A1* | 3/2010 | Lee et al. | 365/185.03 |

FOREIGN PATENT DOCUMENTS

| KR | 1020060057821 A | 5/2006 |
| KR | 1020060060528 A | 6/2006 |
| KR | 100655439 B1 | 12/2006 |

* cited by examiner

*Primary Examiner* — Son Mai
(74) *Attorney, Agent, or Firm* — Volentine & Whitt, PLLC

(57) ABSTRACT

A non-volatile memory device includes first and second strings memory cell transistors, related first and second word lines respectively connected to gates of the first string memory cell transistors, wherein respective first and second word lines are connected to commonly receive a bias voltage. The non-volatile memory device also includes dummy cell transistors connected to the first and second strings, and first and second dummy word lines configured to receive different bias voltages.

18 Claims, 8 Drawing Sheets

Vsub (≅20V)

FIG. 4

| Signal | Program | Erase | Read |
|---|---|---|---|
| Select W/L | Vpgm | 0 | 0 |
| Unselect W/L | Vpass | Floating | Vread |
| Select B/L | 0 | Floating | Precharge |
| Unselect B/L | Vcc | - | - |
| SSL1 | Vcc | Floating | Vread |
| SSL2 | 0 | Floating | 0 |
| GSL1 | 0 | Floating | Vread |
| GSL2 | 0 | Floating | 0 |
| DWL1 | Vpass | Floating | Vread |
| DWL2 | 0 | Floating | Vread |
| DWL3 | Vpass | Floating | Vread |
| DWL4 | 0 | Floating | Vread |
| CSL | 1.5 | Floating | 0 |
| PP-Well | 0 | Verase | 0 |

NON-VOLATILE MEMORY DEVICE AND METHOD OF OPERATING THE SAME

CROSS-REFERENCE TO RELATED APPLICATIONS

This application claims the benefit of Korean Patent Application No. 10-2008-0083025 filed on Aug. 25, 2008, the subject matter of which is hereby incorporated by reference.

BACKGROUND

The inventive concept relates generally to non-volatile memory devices. More particularly, the inventive concept relates to non-volatile memory devices driving dummy word lines corresponding to different memory cell strings and a method of operating such non-volatile memory devices.

Non-volatile memory devices retain stored data in the absence of applied power while at the same time efficiently allowing data to be electrically programmed and erased. Flash memory is one type of commonly used non-volatile memory device.

NAND type flash memory is characterized by an arrangement of memory transistors associated with memory cells into so-called NAND strings. In this type of arrangement, word lines orthogonally traverse the NAND strings and are respectively coupled to one or more memory transistors in each NAND string. While this arrangement of NAND strings and associated word lines is geometrically and operationally efficient, the inadvertent programming (i.e., errant alteration) of stored data in proximate, albeit unselected, NAND strings is a problem.

Numerous attempts have been made to remediate this potential problem. For example, International Patent Publication Nos. WO05/078733 and WO06/124525 disclose one technique for preventing the inadvertent programming of data stored in unselected NAND strings by using channel boosting. Channel boosting may reduce a program potential applied to memory transistors by applying a high boosting voltage to channels of unselected NAND strings.

SUMMARY

Embodiments of the inventive concept provide non-volatile memory devices having dummy cell transistors associated with different strings, and related methods of operation.

In one embodiment, the inventive concept provides a non-volatile memory device comprising; a first string of n memory cell transistors, where "n" is a natural number greater than 2, a second string of n memory cell transistors, a plurality of n first word lines respectively connected to gates of the first string memory cell transistors, a plurality of n second word lines respectively connected to gates of the second string memory cell transistors, wherein respective jth ones of the first and second word lines are connected to commonly receive a bias voltage, where "j" ranges from 1 to n, a first dummy cell transistor connected at a first end of the first string, a second dummy cell transistor connected at a first end of the second string, a first dummy word line connected to the gate of the first dummy cell transistor, and a second dummy word line connected to the gate of the second dummy cell transistor, wherein the first and second dummy word lines are configured to respectively receive different bias voltages independent of one another.

In another embodiment, the inventive concept provides a vertically stacked non-volatile memory device comprising at least two layers, each one of the layers comprising a plurality of memory blocks, the non-volatile memory device comprising; a first string of n memory cell transistors, where "n" is a natural number greater than 2, a second string of n memory cell transistors, a plurality of n first word lines respectively connected to gates of the first string memory cell transistors, a plurality of n second word lines respectively connected to gates of the second string memory cell transistors, wherein respective jth ones of the first and second word lines are connected to commonly receive a bias voltage, where "j" ranges from 1 to n, a first dummy cell transistor connected at a first end of the first string, a second dummy cell transistor connected at a first end of the second string, a first dummy word line connected to the gate of the first dummy cell transistor, and a second dummy word line connected to the gate of the second dummy cell transistor, wherein the first and second dummy word lines are configured to respectively receive different bias voltages independent of one another.

In another embodiment, the inventive concept provides flash memory card comprising; a memory controller configured to program data to a non-volatile memory device, wherein the non-volatile memory device comprises, a first string of n memory cell transistors, where "n" is a natural number greater than 2, a second string of n memory cell transistors, a plurality of n first word lines respectively connected to gates of the first string memory cell transistors, a plurality of n second word lines respectively connected to gates of the second string memory cell transistors, wherein respective jth ones of the first and second word lines are connected to commonly receive a bias voltage, where "j" ranges from 1 to n, a first dummy cell transistor connected at a first end of the first string, a second dummy cell transistor connected at a first end of the second string, a first dummy word line connected to the gate of the first dummy cell transistor, and a second dummy word line connected to the gate of the second dummy cell transistor, wherein the first and second dummy word lines are configured to respectively receive different bias voltages independent of one another.

In another embodiment, the inventive concept provides a system comprising; a central processing unit configured to control the operation of a memory controller and communicate program data to the memory controller via a system bus, the memory controller being configured to program the program data to a non-volatile memory device, the non-volatile memory device comprising; a first string of n memory cell transistors, where "n" is a natural number greater than 2, a second string of n memory cell transistors, a plurality of n first word lines respectively connected to gates of the first string memory cell transistors, a plurality of n second word lines respectively connected to gates of the second string memory cell transistors, wherein respective jth ones of the first and second word lines are connected to commonly receive a bias voltage, where "j" ranges from 1 to n, a first dummy cell transistor connected at a first end of the first string, a second dummy cell transistor connected at a first end of the second string, a first dummy word line connected to the gate of the first dummy cell transistor, and a second dummy word line connected to the gate of the second dummy cell transistor, wherein the first and second dummy word lines are configured to respectively receive different bias voltages independent of one another.

In another embodiment, the inventive concept provides a method of operating a non-volatile memory device comprising first and second strings, each string comprising a dummy cell transistor and a plurality of n memory cell transistors, where "n" is a natural number greater than 2, the method comprising; independently applying different bias voltages to the dummy cell transistor of the first string and the dummy cell transistor of the second string, and respectively applying a same bias voltage to each jth memory cell transistor in the first and second strings, where "j" ranges from 1 to n, using commonly connected word lines receiving the same bias voltage.

BRIEF DESCRIPTION OF THE DRAWINGS

Exemplary embodiments of the inventive concept will be described hereafter with reference to the accompanying drawings in which:

FIG. 4 is a chart illustrating bias conditions for exemplary operations of the non-volatile memory device of FIG. 3;

DESCRIPTION OF THE EMBODIMENTS

Embodiments of the inventive concept will now be described in some additional detail with reference to the accompanying drawings. Throughout the written description and drawings, like reference numbers and indications refer to like or similar elements.

It should be noted that the inventive concept may be variously embodied and should not be construed as being limited to only the illustrated embodiments. Rather, these embodiments are presented as teaching examples.

The non-volatile memory cells constituting a flash memory generally include a cell transistor having a control gate, a floating gate, a source, and a drain. This cell transistor is programmed or erased using a well understood phenomenon known as the Fowler-Nordheim (F-N) tunnelling effect.

A cell transistor is typically erased by applying a ground voltage to the control gate of the cell transistor and applying a voltage higher than an applied power voltage to a semiconductor substrate (or bulk). Under these erase bias conditions, a strong electric field is created between the floating gate and the bulk due to the large voltage difference that exists between the floating gate and the bulk. Under the influence of this strong electric field, electrons present on the floating gate migrate to the bulk by means of the F-N tunnelling effect. With the resulting removal electrons, the threshold voltage of the erased cell transistor is reduced.

A cell transistor is typically programmed by applying a voltage higher than the power voltage to the control gate and applying a ground voltage to the drain and bulk. Under these program bias conditions, electrons are injected onto the floating gate of the cell transistor by means of the F-N tunnelling effect. With the resulting injection of electrons, the threshold voltage of the programmed cell transistor is increased.

FIGS. (FIGS.) 1A and 1B are cross-sectional views of non-volatile memory cells that may be incorporated into embodiments of the inventive concept. The construction and operation of the memory cells is essentially conventional at the present level of discussion.

Figure 1A:
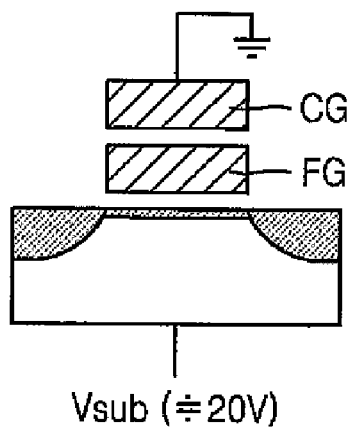
FIGS. 1A and 1B are cross-sectional views of a non-volatile memory cell that may be used within embodiments of the inventive concept.
Figure 1B:
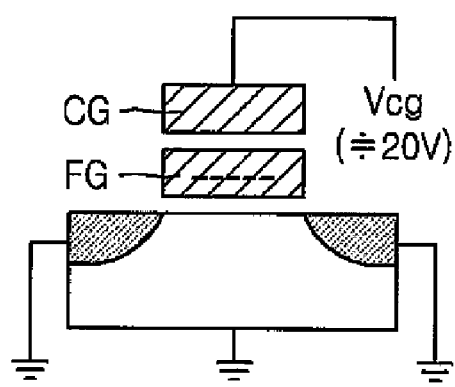

FIG. 1A illustrates a memory cell in an "erase state" wherein electrons are substantially removed from the floating gate FG of the non-volatile memory cell. In contrast, FIG. 1B illustrates a memory cell in a "program state" wherein electrons are injected onto the floating gate FG of the non-volatile memory device.

Figure 2:
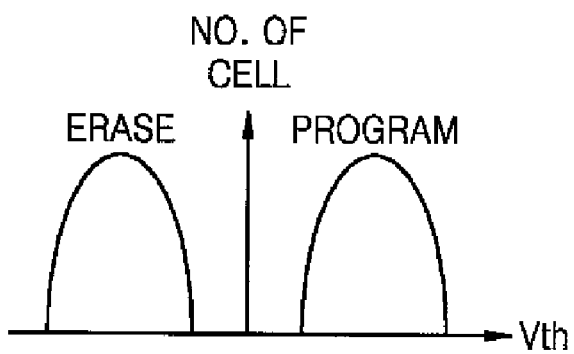
FIG. 2 is a graphical representation of programmed memory states for memory cell(s) of FIG. 1.

FIG. 2 is a graphical illustration of these two memory cell states. Referring to FIG. 2, the threshold voltage associated with the program state is greater than 0V while the threshold voltage associated with the erase state is less than 0V.

Figure 3:
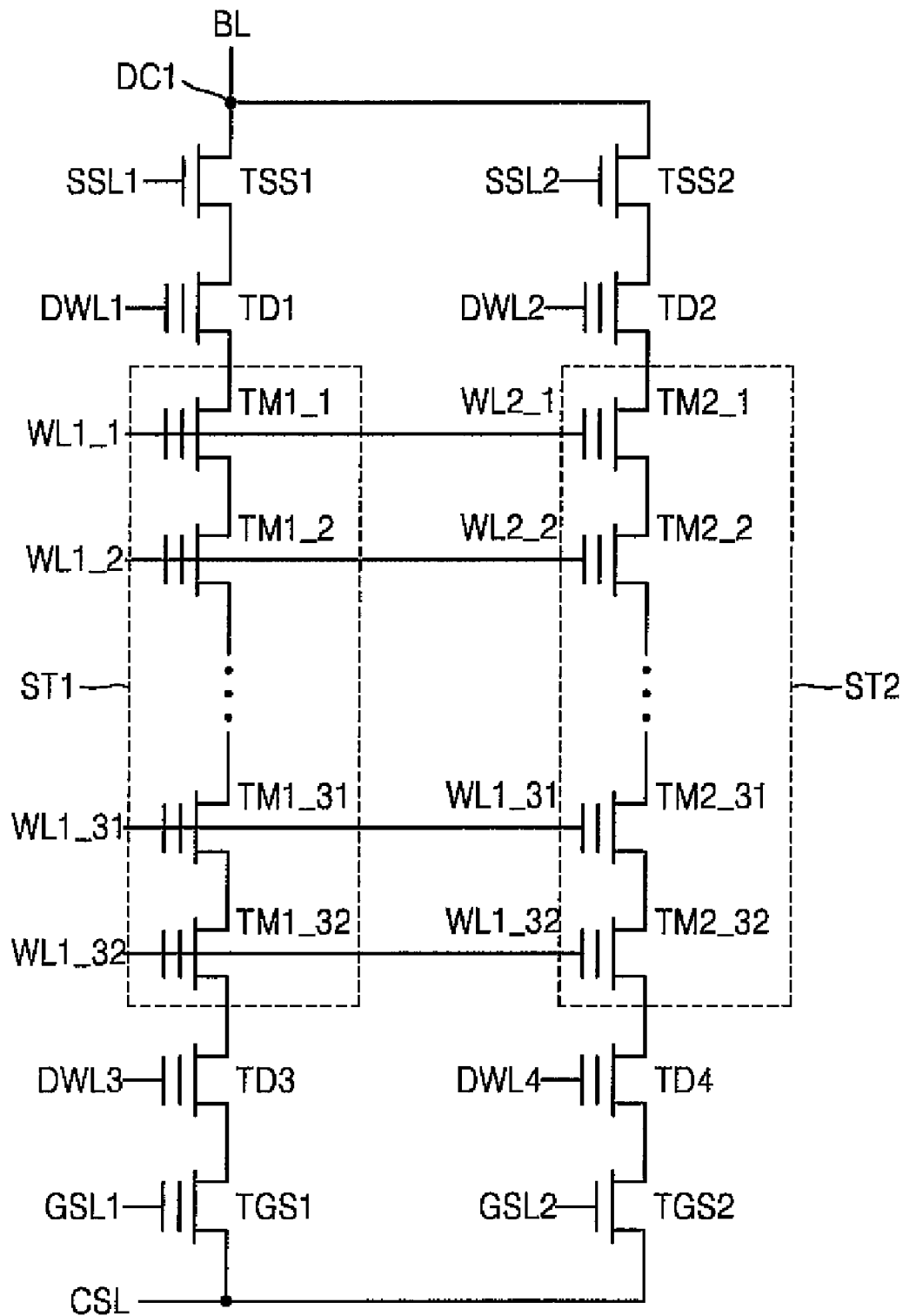
FIG. 3 is a circuit diagram of a non-volatile memory device according to an embodiment of the inventive concept.

FIG. 3 is a circuit diagram of a non-volatile memory device according to an embodiment of the inventive concept. Referring to FIG. 3, the non-volatile memory device comprises a first string ST1 and a second string ST2. Each of the first string ST1 and second string ST2 includes "n", where n is a natural number greater than 2, vertically aligned memory cell transistors. In the specific illustrated example "n" is equal to 32, including memory cell transistors TM1_1 through TM1_32, but those skilled in the art will recognize that this is merely one possible arrangement. Any reasonable number of memory cell transistors might be arranged in strings associated with embodiments of the inventive concept. In this context, the term "vertically aligned" is merely an arbitrary direction used in conjunction with the illustrated example of FIG. 3. No particular geometry is mandated by the illustrated embodiment which is presented for purposes of providing a clear teaching example.

The non-volatile memory device of FIG. 3 also comprises "n" first word lines WL1_1 through WL1_32 and "n" second word lines WL2_1 through WL2_32. The first word lines WL1_1 through WL1_32 are respectively connected to the gates of the first string ST1 of memory cell transistors TM1_1 through TM1_32, and the second word lines WL2_1 through WL2_32 are respectively connected to the gates of the second string ST2 memory cell transistors TM2_1 through TM2_32.

Each string of memory cell transistors TM1_1 through TM1_32 and TM2_1 through TM2_32 may be programmed, read, and/or erased by respectively applying various voltages, (e.g., a program voltage, a read voltage, and an erase voltage) to the gates of the memory cell transistors TM1_1 through TM1_32 and TM2_1 through TM2_32. This ability will be explained in some additional detail with reference to FIG. 4.

Among the first word lines WL1_1 through WL1_32 and the second word lines WL2_1 through WL2_32, a jth first word line (where "j" ranges from 1 to "n") and a jth second word line are respectively connected. Referring to FIG. 3, a $1^{st}$ first word line WL1_1 and a $1^{st}$ second word line WL2_1 are connected to each other. Likewise, the $31^{st}$ and $32^{nd}$ first word lines WL1_31 and WL1_32 are respectively connected to the $31^{st}$ and $32^{nd}$ second word lines WL2_31 and WL2_32, and so on.

The commonly connected jth word lines from each plurality of word lines (i.e., $1^{st}$ and $2^{nd}$ plurality of word lines) receive the same bias voltage. Such a received voltage is thus commonly applied to the gates of corresponding memory cell transistors. For example, the $1^{st}$ first word line WL1_1 and the $1^{st}$ second word line WL2_1 receive the same bias voltage and apply it to the gates of the memory cell transistors TM1_1 and TM2_1.

Of further note, the non-volatile memory device of FIG. 3 includes a first dummy cell transistor TD1 and a second dummy cell transistor TD2, along with corresponding first dummy word line DWL1 and second dummy word line DWL2.

The first dummy cell transistor TD1 is connected to the $1^{st}$ memory cell transistor TM1_1 in the first plurality of memory cell transistors. More particularly, the first dummy cell transistor TD1 is connected at one end the first string ST1, and the second dummy cell transistor TD2 is connected at one end of the second string ST2. The first dummy word line DWL1 is connected to a gate of the first dummy cell transistor TD1, and the second dummy word line DWL2 is connected to a gate of the second dummy cell transistor TD2.

The first dummy word line DWL1 and the second dummy word line DWL2 are not connected to each other. Thus, the first dummy word line DWL1 and the second dummy word line DWL2 may receive different bias voltages and apply the different bias voltages to the first and second dummy cell transistors TD1 and TD2. Accordingly, the likelihood of programming disturbances (i.e., inadvertent programming) between the memory cell transistors TM1_1 and TM2_1 may be markedly reduced.

The non-volatile memory device of FIG. 3 also comprises a third dummy cell transistor TD3, a fourth dummy cell transistor TD4, a third dummy word line DWL3, and a fourth dummy word line DWL4.

The third and fourth dummy cell transistors TD3 and TD4 are respectively connected to the other end of the first and second dummy cell transistors TD1 and TD2. That is, the dummy cell transistors TD1, TD2, TD3, and TD4 are respectively disposed at opposite first and second ends of the first and second string ST1 and ST2. In the illustrated example of FIG. 3, the third dummy cell transistor TD3 is connected to the memory cell transistor TM1_32 disposed at the second end of the first string ST1. The fourth dummy cell transistor TD4 is connected to the memory cell transistor TM2_32 disposed at the second end of the second string ST2. The third dummy word line DWL3 is connected to a gate of the third dummy cell transistor TD3, and the fourth dummy word line DWL4 is connected to a gate of the fourth dummy cell transistor TD4.

The third dummy word line DWL3 and the fourth dummy word line DWL4 are not connected to each other. Thus, the third dummy word line DWL3 and the fourth dummy word line DWL4 may receive different bias voltages and apply the different bias voltages to the third and fourth dummy cell transistors TD3 and TD4.

Although the first through fourth dummy word lines DWL1 through DWL4 are connected to the first and second strings ST1 and ST2 in FIG. 3, the first through fourth dummy word lines DWL1 through DWL4 may be included in the first and second strings ST1 and ST2.

In certain embodiments of the inventive concept, the first string ST1 and the second string ST2 may be disposed in different layers within a multi-layer non-volatile memory device. Alternatively, the first string ST1 and the second string ST2 may be disposed in different memory blocks disposed at the same layer.

The non-volatile memory device of FIG. 3 may further include a first ground select transistor TGS1, a first string select transistor TSS1, a second ground select transistor TGS2, and a second string select transistor TSS2. Each of the first ground select transistor TGS1 and the first string select transistor TSS1 may be connected to the first string ST1, and each of the second ground select transistor TGS2 and the second string select transistor TSS2 may be connected to the second string ST2.

The non-volatile memory device of FIG. 3 may further include a charge supply line CSL and a bit line BL. The charge supply line CSL supplies charges to the first and second strings ST1 and ST2. The charge supply line CSL may be a common source line. The bit line BL may be shared by the first and second strings ST1 and ST2.

FIG. 4 illustrates exemplary bias conditions for the non-volatile memory device of FIG. 3 in relation to program, erase and read operations.

An exemplary program operation will now be explained under an assumption that the $2^{nd}$ memory cell transistor TM1_2 in the first string ST1 is designated as a "target memory cell transistor" associated with a target memory cell to be programmed.

In order to program the target memory cell transistor TM1_2, the first string select transistor TSS1 connected to the first string ST1 to which the target memory cell transistor TM1_2 belongs is turned ON. To this end, a power voltage Vcc is applied to the gate of the first string select transistor TSS1. Also, the first ground select transistor TGS1 connected to the first string ST1 is turned OFF. The first and third dummy cell transistors TD1 and TD3 are turned ON by applying a pass voltage Vpass to the gates of the first and third dummy cell transistors TD1 and TD3 through the first and third dummy word lines DWL1 and DWL3. The "pass voltage Vpass" in this context refers to a voltage greater than the threshold voltage of each of the first and third dummy cell transistors TD1 and TD3.

A program voltage Vpgm is then applied to the gate of the target memory cell transistor TM1_2, and a pass voltage Vpass is applied to the gates of the remaining memory cell transistors TM1_1 and TM1_3 through TM1_32. The "program voltage Vpgm" in this context refers to a voltage greater than the pass voltage Vpass.

If 0V is applied to the selected bit line BL, electrical charge on the selected bit line BL is transferred to the target memory cell transistor TM1_2 via the first dummy cell transistor TD1, which is turned ON, and the memory cell transistor TM1_1. Depending on the level of the program voltage Vpgm, that is, depending on the value of program data, the quantity of charge injected onto the target memory cell transistor TM1_2 varies, and accordingly, a threshold voltage for the target memory cell transistor TM1_2 will be variably developed accordingly. For example, if the value of program data is '0', the threshold voltage of the target memory cell transistor TM1_2 will be relatively high, but if the value of program data is '1', the threshold voltage of the target memory cell transistor TM1_2 will be relatively low.

The second ground select transistor TGS2 and the second string select transistor TSS2 connected to the second string ST2 to which the target memory cell transistor TM1_2 does not belong are turned OFF. The second and fourth dummy cell transistors TD2 and TD4 are turned OFF by applying 0V to the gates of the second and fourth dummy cell transistors TD2 and TD4 through the second and fourth dummy word lines DWL2 and DWL4. Accordingly, boosted charges in channels can easily exit through the second ground select transistor TGS2 and the second string select transistor TSS2. That is, an inhibit operation may be normally performed.

Accordingly, the non-volatile memory device of FIG. 3 can apply different bias voltages to the second and fourth dummy word lines DWL2 and DWL4 of the second string ST2 to which the target memory cell transistor TM1_2 does not belong, as compared with the first and third dummy word lines DWL1 and DWL3 of the first string ST1 to which the target memory cell transistor TM1_2 belongs. Hence, a program operation with an inhibit operation may be smoothly performed.

Assuming that the first dummy word line DWL1 and the second dummy word line DWL2 are connected to each other, if a pass voltage Vpass is applied to the first dummy word line DWL1 connected to the first string ST1 to which the target memory cell transistor TM1_2 belongs, the pass voltage Vpass may also be applied to the second dummy word line DWL2 connected to the second string ST2 to which the target memory cell transistor TM1_2 does not belong. In this case, boosted charges cannot easily exit.

An exemplary read operation will now be explained again assuming that the memory cell transistor TM1_2 is the target memory cell transistor to be read.

A potential of 0V is applied to the word line WL1_2 connected to the target memory cell transistor TM1_2. Also, if the word line WL1_2 is connected to the word line WL2_2, 0V is also applied to the word line WL2_2. A read voltage Vread is applied to the remaining word lines WL1_1 and WL1_3 through WL1_32, and WL2_1 and WL2_3 through WL2_32. The "read voltage Vread" refers to a voltage allowing current to flow through the memory cell transistors TM1_1 and TM1_3 through TM1_32, and TM2_1 and TM2_3 through TM2_32 irrespective of threshold voltages of the memory cell transistors TM1_1 and TM1_3 through TM1_32, and TM2_1 and TM2_3 through TM2_32.

A read voltage Vread is also applied to gates of the first string select transistor TSS1 and the first ground select transistor TGS1 connected to the first string ST1 to which the target memory cell transistor TM1_2 belongs. The read voltage Vread is also applied to the first through fourth dummy cell transistors TD1 through TD4.

In an erase operation, an erase voltage Verase is applied to a substrate, 0V is applied to a gate of a target transistor to be erased, and gates of transistors other than the target transistor are floated.

Figure 5:
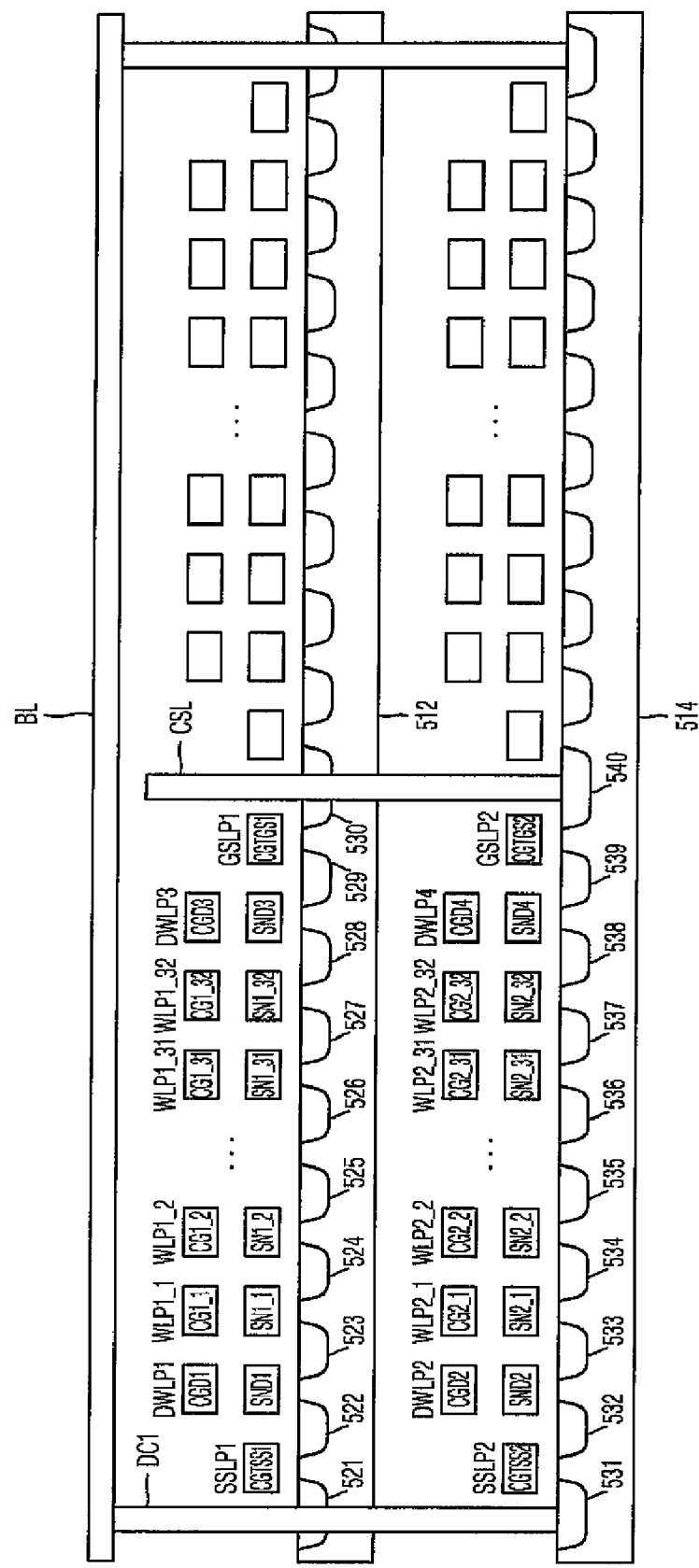
FIG. 5 is a front view of the non-volatile memory device of FIG. 3.
Figure 6:
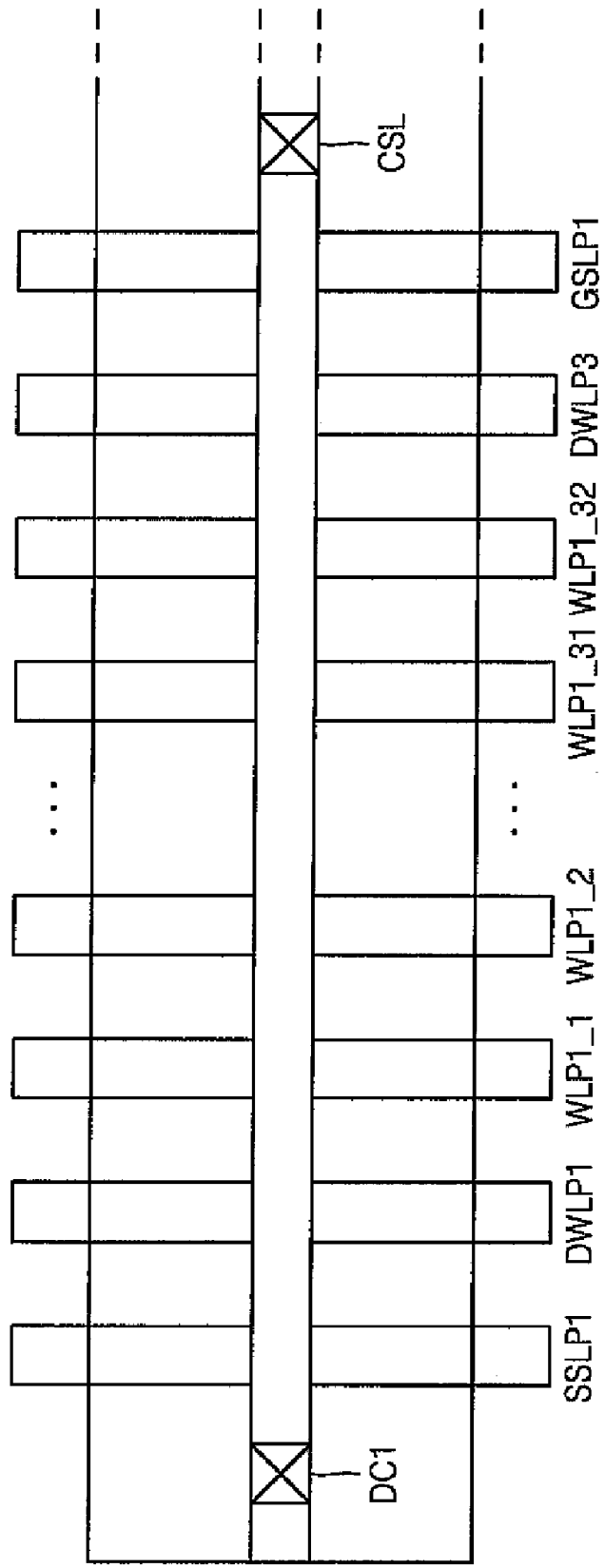
FIG. 6 is a plan view of the non-volatile memory device of FIG. 3.

FIG. 5 is a front view of the non-volatile memory device of FIG. 3, and FIG. 6 is a plan view of the non-volatile memory device of FIG. 3.

The non-volatile memory device of FIG. 3 is assumed to be implemented in a multi-layer structure including at least two vertically stacked physical layers each including two strings as shown in FIGS. 5 and 6. That is, a vertically stacked, non-volatile memory device including 4 strings is assumed for purposes of illustration. However, only 2 strings among the 4 strings of FIGS. 5 and 6 are illustrated in FIG. 3.

It is assumed that two strings located in first and second layers on the left side of FIGS. 5 and 6 are the two strings ST1 and ST2 of FIG. 3. Of course, two strings in first and second layers on the right side may be the two strings ST1 and ST2 of FIG. 3, or one string in a first layer (or a second layer) on the left side and one string in a first layer (or a second layer) on the right side may be the two strings ST1 and ST2 of FIG. 3.

Although the non-volatile memory device includes two layers in FIGS. 5 and 6, the non-volatile memory device may include three or more layers or one layer.

Referring to FIGS. 5 and 6, the memory cell transistors TM1_1 through TM1_32 and TM2_1 through TM2_32 include stacked structures in which charge storage layers SN1_1 through SN1_32 and SN2_1 through SN2_32 and control gate electrodes CG1_1 through CG1_32 and CG2_1 through CG2_32 are respectively stacked on semiconductor substrates 512 and 514. Also, the memory cell transistors TM1_1 through TM1_32 and TM2_1 through TM2_32 may include source and drain regions 521 through 530 and 531 through 540. For example, the memory cell transistor TM1_1 may include the source and drain regions 523 and 524, the charge storage layer SN1_1, and the control gate electrode CG1_1.

The control gate electrodes CG1_1 through CG1_32 and CG2_1 through CG2_32 are disposed over the charge storage layers SN1_1 through SN1_32 and SN2_1 through SN2_32 to be spaced apart from the charge storage layers SN1_1 through SN1_32 and SN2_1 through SN2_32 by a blocking insulating layer (not shown). The charge storage layers SN1_1 through SN1_32 and SN2_1 through SN2_32 may be used as floating gate layers or charge trap layers. Furthermore, a tunneling insulating layer (not shown) may be interposed between the semiconductor substrates 512 and 514 and the charge storage layers SN1_1 through SN1_32 and SN2_1 through SN2_32.

The source and drain regions 521 through 530 and 531 through 540 may be formed by doping impurities into the semiconductor substrates 512 and 514. For example, if the semiconductor substrates 512 and 514 are of a first conductive type, the source and drain regions 521 through 530, 531 through 540 may be formed by doping impurities of a second conductive type that is opposite to the first conductive type. Accordingly, the source and drain regions 521 through 530 and 531 through 540 may form diode junction with the semiconductor substrates 512 and 514.

Part of each of the semiconductor substrates 512 and 514 may serve as a conductive path through which charges are transferred. Each of the semiconductor substrates 512 and 514 may include silicon, germanium, or silicon-germanium.

The control gate electrodes CG1_1 through CG1_32 and CG2_1 through CG2_32 may be included in word line patterns WLP1_1 through WLP1_32 and WLP2_1 through WLP2_32 (see FIG. 6). The word line patterns WLP1_1 through WLP1_32 and WLP2_1 through WLP2_32 may act as the word lines WL1_1 through WL1_32 and WL2_1 through WL2_32 of FIG. 3 (see FIG. 6).

The first through fourth dummy cell transistors TD1 through TD4 of FIG. 3 have similar structures to those of the memory cell transistors TM1_1 through TM1_32 and TM2_1 through TM2_32. For example, the first dummy cell transistor TD1 may include the source and drain regions 522 and 523, the charge storage layer SND1, and the control gate electrode CGD1.

The first string select transistor TSS1 of FIG. 3 may include a gate electrode CGTSS1 and the source and drain regions 521 and 522 on the semiconductor substrate 512. The second string select transistor TSS2 may include a gate electrode CGTSS2 and the source and drain regions 531 and 532 on the semiconductor substrate 514. The first ground select transistor TGS1 of FIG. 3 may include a gate electrode CGTGS1 and the source and drain regions 529 and 530 on the semiconductor substrate 512. The second ground select transistor TGS2 may include a gate electrode CGTGS2 and the source and drain regions 539 and 540 on the semiconductor substrate 514.

The gate electrodes CGTSS1 and CGTSS2 may be included in string select line patterns SSLP1 and SSLP2 constituting the first and second string select lines SSL1 and SSL2, respectively (see FIG. 6). The gate electrodes CGTGS1 and CGTGS2 may be included in ground select line patterns GSLP1 and GSLP2 constituting the first and second ground select lines GSL1 and GSL2, respectively (see FIG. 6).

A bit line BL is connected to the source and drain regions 521 and 531 of the semiconductor substrates 512 and 514 through a contact DC. The contact DC vertically passes through the semiconductor substrates 512 and 514 so as to electrically connect the bit line BL to the source and drain regions 521 and 531.

The common source line CSL is electrically connected to the source and drain regions 530 and 540 of the semiconductor substrates 512 and 514. The common source line CSL vertically passes through the semiconductor substrates 312 and 314 so as to be connected to the source and drain regions 530 and 540.

Figure 7:
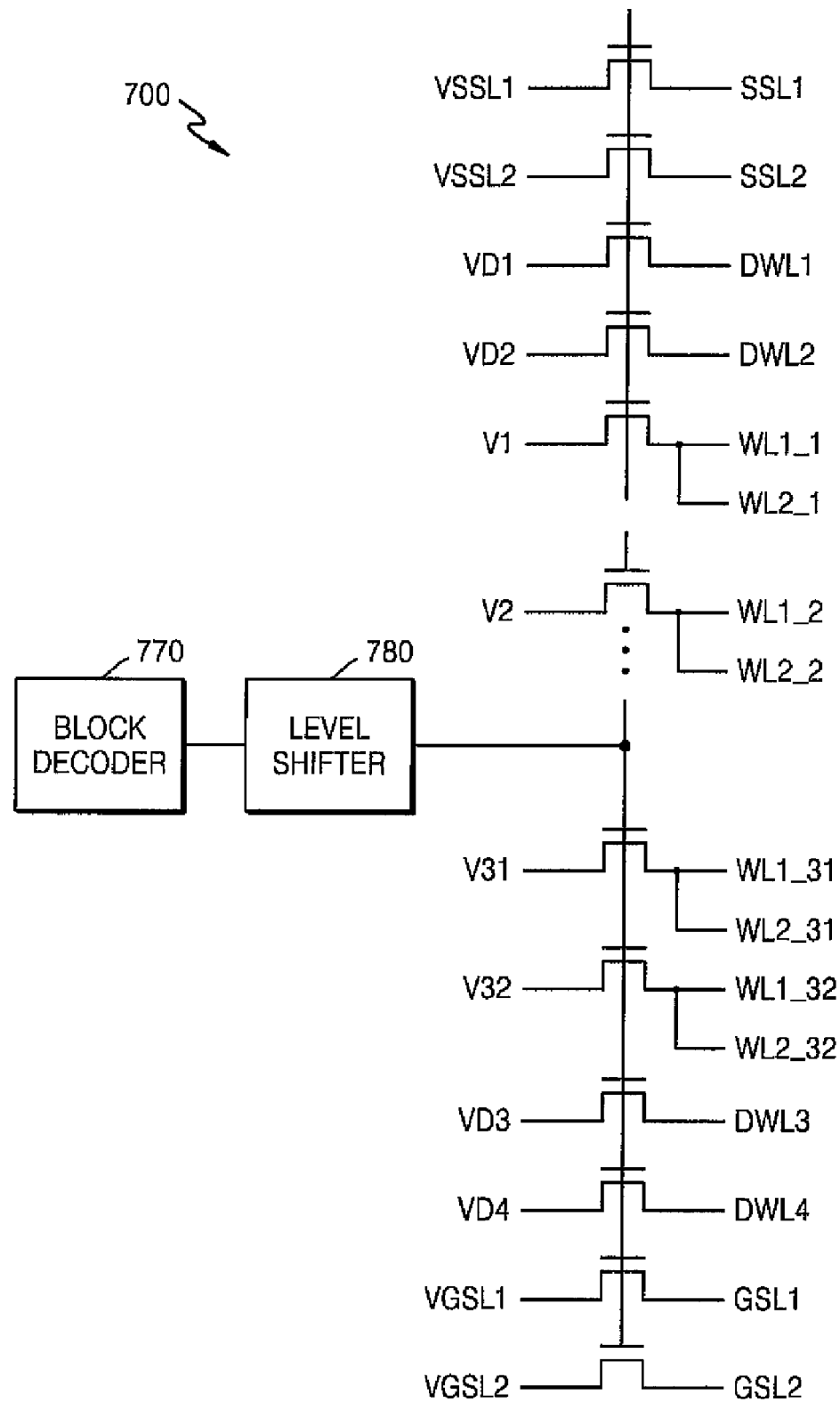
FIG. 7 is a circuit diagram of a decoder that may be used in conjunction with the non-volatile memory device of FIG. 3 according to an embodiment of the inventive concept.

FIG. 7 is a circuit diagram of a decoder 700 that may be operatively incorporated with the non-volatile memory devices of FIGS. 3, 5 and 6 according to an embodiment of the inventive concept.

The decoder 700 connects the first word lines WL1_1 through WL1_32 and the second word lines WL2_1 through WL2_32, which are respectively connected to the different strings ST1 and ST2, and respectively applies the same bias voltages V1 through V32 to the first word lines WL1_1 through WL1_32 and the second word lines WL2_1 through WL2_32.

The decoder 700 is capable of applying different bias voltages VD1 through VD4 to the first through fourth dummy word lines DWL1 through DWL4. The decoder 700 is also capable of applying corresponding bias voltages VSSL1, VSSL2, VGSL1, and VGSL2 to the first and second string select lines SSL1 and SSL2 and the first and second ground select lines GSL1 and GSL2.

The decoder 700 may include a plurality of decoding units and perform the above operations by using the decoding units. The decoder 700 may further include a block decoder 770 and a level shifter 780. The block decoder 770 selects a specific memory block and the level shifter 780 changes the level of a received signal.

Figure 8:
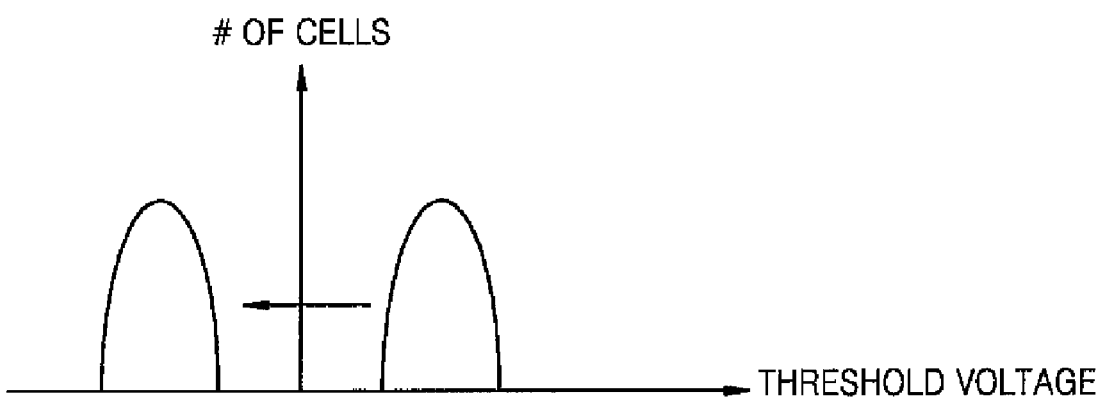
FIGS. 8 and 9 are graphical representation that further explain a method of changing the threshold voltage of a dummy cell transistor of the non-volatile memory device of FIG. 3.
Figure 9:
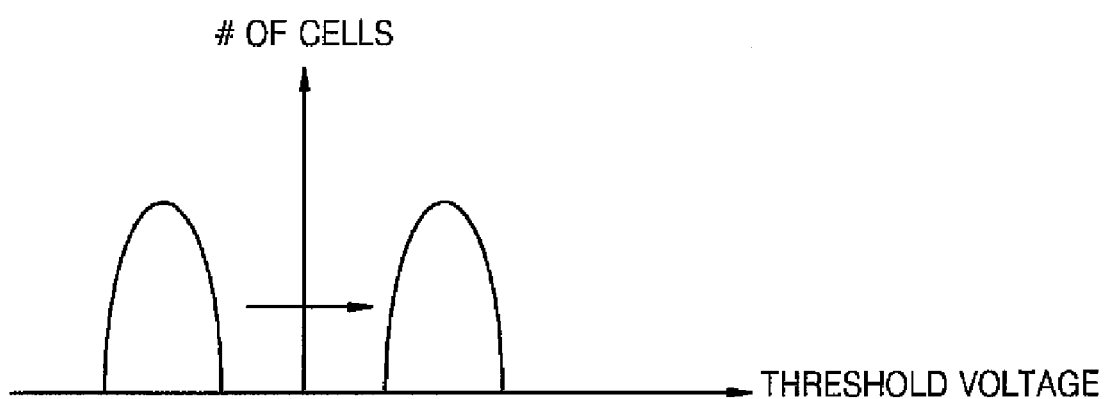

FIGS. 8 and 9 are graphs further explaining a method of changing a threshold voltage of a dummy cell transistor of the non-volatile memory device of FIG. 3.

Here, it is again assumed that the memory cell transistor TM1_2 is a target memory cell transistor to be programmed. Before the target memory cell transistor TM1_2 is programmed, threshold voltages of the first and third dummy cell transistors TD1 and TD3 connected to the first string ST1 to which the target memory cell transistor TM1_2 belongs may be reduced. Also, threshold voltages of the second and fourth dummy cell transistors TD2 and TD4 connected to the second string ST2 may be increased. The threshold voltages of the first and third dummy cell transistors TD1 and TD3 may be reduced below 0V, and the threshold voltages of the second and fourth dummy cell transistors TD2 and TD4 may be increased above 0V. For example, the first and third dummy cell transistors TD1 and TD3 may be changed to an erase state. FIG. 8 illustrates threshold voltages of the first and third dummy cell transistors TD1 and TD3 being reduced. FIG. 9 illustrates threshold voltages of the second and fourth dummy cell transistors TD2 and TD4 being increased.

Once the threshold voltages of the first and third dummy cell transistors TD1 and TD3 are reduced, when a pass voltage Vpass is applied to the gates of the first and third dummy cell transistors TD1 and TD3 in order to program the target memory cell transistor TM1_2, the first and third dummy cell transistors TD1 and TD3 may be easily turned on. Accordingly, the target memory cell transistor TM1_2 can be smoothly programmed.

Once the threshold voltages of the second and fourth dummy cell transistors TD2 and TD4 are increased, when 0V is applied to the gates of the second and fourth dummy cell transistors TD2 and TD4 in order to program the target memory cell transistor TM1_2, the second and fourth dummy cell transistors TD2 and TD4 may be certainly turned off. That is, the second and fourth dummy cell transistors TD2 and TD4 can be more certainly turned off when the threshold voltages of the second and fourth dummy cell transistors TD2 and TD4 are increased than when the threshold voltages of the second and fourth dummy cell transistors TD2 and TD4 are not increased.

The memory cell transistors included in the foregoing non-volatile memory devices may be NAND flash memory cell transistors.

The non-volatile memory device may be mounted on a memory card for supporting high capacity data storage or an information processing system such as a mobile device or a desktop computer.

Figure 10:
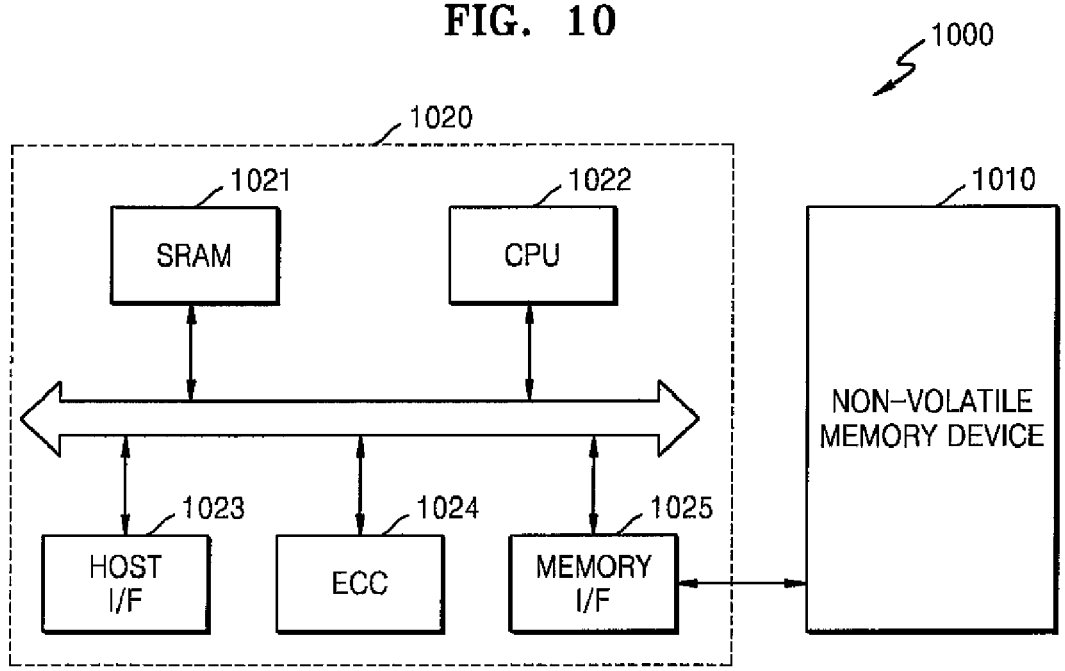
FIG. 10 is a block diagram of a memory card according to an embodiment of the inventive concept.

FIG. 10 is a block diagram of a memory card 1000 according to an embodiment of the inventive concept.

Referring to FIG. 10, the memory card 1000 may include a non-volatile memory device 1010. The memory card 1000 may include a memory controller 1020 controlling data exchange between the non-volatile memory device 1010 and a host.

A static random access memory (SRAM) 1021 is used as an operation memory of a processing unit 1022. A host interface 1023 includes a data exchange protocol of the host connected to the memory card 1000. An error correction block 1024 detects and corrects an error included in data read from the non-volatile memory device 1010. A memory interface 1025 interfaces with the non-volatile memory device 1010. The processing unit 1022 controls the operation of the memory controller 1020. Although not shown, the memory card 1000 may further include a read-only memory (ROM, not shown) storing code data for interfacing with the host.

The non-volatile memory device 1010 and the memory card 1000 may be provided to a memory system such as a solid state disk (SSD) that is a semiconductor disk device.

Figure 11:
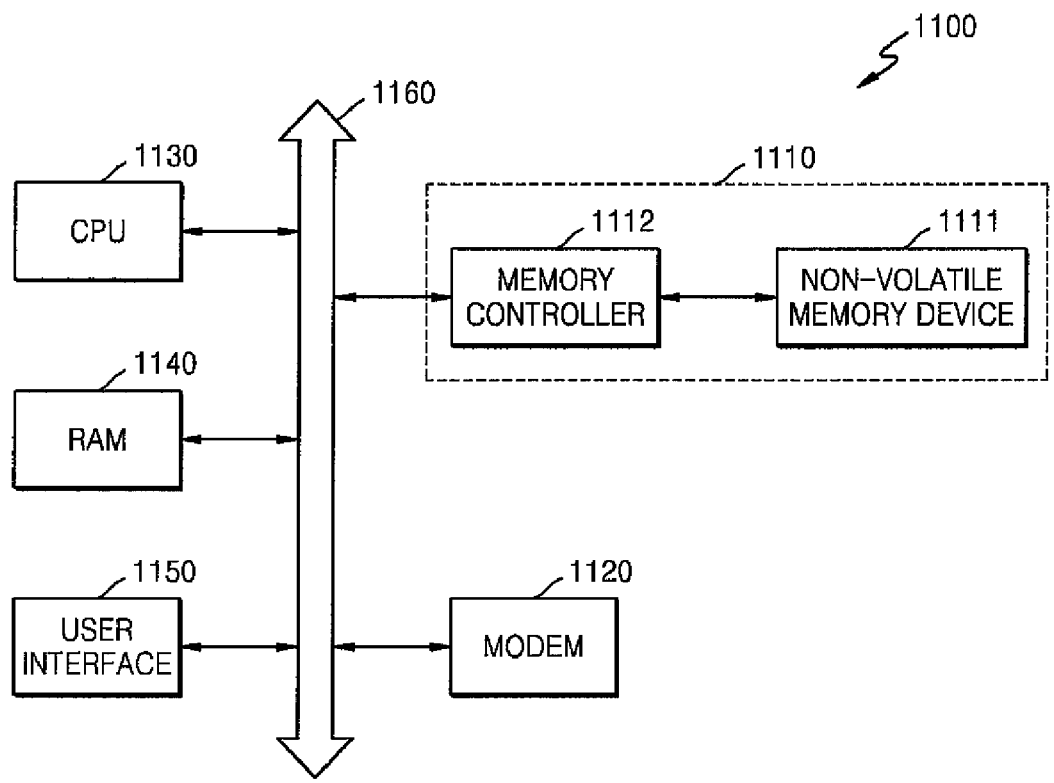
FIG. 11 is a block diagram of an information processing system according to an embodiment of the inventive concept.

FIG. 11 is a block diagram of an information processing system 1100 according to an embodiment of the inventive concept.

Referring to FIG. 11, the information processing system 1100 may include a non-volatile memory device 1111. The non-volatile memory device 1111 may be included in a non-volatile memory system 1110. The information processing system 1100 includes the non-volatile memory system 1110, a modem 1120, a central processing unit (CPU) 1130, a random access memory (RAM) 1140, and a user interface 1150 which are electrically connected to a system bus 1160. The non-volatile memory system 1110 stores data processed by the CPU 1130 or data input from an external source. Here, the non-volatile memory system 1110 may be an SDD, and in this case, the information processing system 1100 can stably store a large amount of data in the non-volatile memory system 1110. Due to improved reliability, the non-volatile memory system 1110 can reduce resources required to correct errors and thus the non-volatile memory system 1110 can exchange data at high speed in the information processing system 1100. Although not shown, the information processing system 1100 may be further provided with an application chipset, a camera image processor (CIS), a mobile dynamic random access memory (DRAM), or an input/output device.

The non-volatile memory device according to the inventive concept may be a flash memory device that can retain stored data even when not powered. As the use of mobile devices, such as a cellular phone, a personal digital assistant (PDA), a digital camera, a portable game console, and an MP3P, has increased, flash memory devices have been widely used as code storages as well as data storages. Flash memory devices can also be used in home applications such as a high definition television (HDTV), a digital versatile disk (DVD), a router, and a global positioning system (GPS).

Also, the non-volatile memory device according to the inventive concept may be mounted in various package manners. For example, the non-volatile memory device may be packaged by package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

A method of operating a non-volatile memory device, which includes a plurality of memory cell transistors that are aligned and a plurality of strings each including one or more dummy cell transistors, according to an embodiment of the inventive concept will now be explained in brief.

The method includes; applying different bias voltages to a first dummy cell transistor connected to a first string that includes a target transistor to be operated among the plurality of memory cell transistors and to a second dummy cell transistor connected to a second string; and applying the same bias voltage to a jth (j is a natural number less than n) memory cell transistor belonging to the first string and to a jth memory cell transistor belonging to the second string.

While the inventive concept has been particularly shown and described with reference to exemplary embodiments thereof using specific terms, the embodiments and terms have been used to explain the inventive concept and should not be construed as limiting the scope of the inventive concept defined by the claims. The preferred embodiments should be considered in a descriptive sense only and not for purposes of limitation. Therefore, the scope of the inventive concept is defined not by the detailed description of the inventive concept but by the appended claims, and all differences within the scope will be construed as being included in the inventive concept.

What is claimed is:

1. A non-volatile memory device comprising:
a first string of n memory cell transistors, where "n" is a natural number greater than 2;
a second string of n memory cell transistors;
a plurality of n first word lines respectively connected to gates of the first string memory cell transistors;
a plurality of n second word lines respectively connected to gates of the second string memory cell transistors;
wherein respective jth ones of the first and second word lines are connected to commonly receive a bias voltage, where "j" ranges from 1 to n;
a first dummy cell transistor connected at a first end of the first string;
a second dummy cell transistor connected at a first end of the second string;
a first dummy word line connected to the gate of the first dummy cell transistor; and
a second dummy word line connected to the gate of the second dummy cell transistor,
wherein the first and second dummy word lines are configured to respectively receive different bias voltages independent of one another.

2. The non-volatile memory device of claim 1, further comprising:
a third dummy cell transistor connected to a second end of the first string opposite the first end;
a fourth dummy cell transistor connected to a second end of the second string opposite the first end;
a third dummy word line connected to the gate of the third dummy cell transistor; and
a fourth dummy word line connected to the gate of the fourth dummy cell transistor,
wherein the third and fourth dummy word lines are configured to respectively receive different bias voltages independent of one another.

3. The non-volatile memory device of claim 1, wherein the non-volatile memory device is a vertically stacked multi-layer device and the first and second strings are disposed in different layers within the vertically stacked multi-layer device.

4. The non-volatile memory device of claim 1, wherein the first string and the second string are respectively associated with different memory blocks in a single layer non-volatile memory device.

5. The non-volatile memory device of claim 1, wherein the non-volatile memory device is a vertically stacked multi-layer device, and the first and second strings are respectively associated with different memory blocks in the same layer of the vertically stacked multi-layer device.

6. The non-volatile memory device of claim 1, further comprising:
a first ground select transistor connected to the first string;
a first string select transistor connected to the first string;
a second ground select transistor connected to the second string; and
a second string select transistor connected to the second string.

7. The non-volatile memory device of claim 1, further comprising:
a charge supply line selectively supplying charge to the first and second strings; and
a bit line shared by the first and second strings.

8. The non-volatile memory device of claim 1, further comprising:
a decoder connecting the jth first word line to the jth second word line.

9. The non-volatile memory device of claim 1, wherein the memory cell transistors are NAND flash memory cell transistors.

10. A vertically stacked non-volatile memory device comprising at least two layers, each one of the layers comprising a plurality of memory blocks, the non-volatile memory device comprising:
a first string of n memory cell transistors, where "n" is a natural number greater than 2;
a second string of n memory cell transistors;
a plurality of n first word lines respectively connected to gates of the first string memory cell transistors;
a plurality of n second word lines respectively connected to gates of the second string memory cell transistors;
wherein respective jth ones of the first and second word lines are connected to commonly receive a bias voltage, where "j" ranges from 1 to n;
a first dummy cell transistor connected at a first end of the first string;
a second dummy cell transistor connected at a first end of the second string;
a first dummy word line connected to the gate of the first dummy cell transistor; and
a second dummy word line connected to the gate of the second dummy cell transistor, wherein the first and second dummy word lines are configured to respectively receive different bias voltages independent of one another.

11. The vertically stacked non-volatile memory device of claim 10, further comprising:
   a third dummy cell transistor connected to a second end of the first string opposite the first end;
   a fourth dummy cell transistor connected to a second end of the second string opposite the first end;
   a third dummy word line connected to the gate of the third dummy cell transistor; and
   a fourth dummy word line connected to the gate of the fourth dummy cell transistor,
   wherein the third and fourth dummy word lines are configured to respectively receive different bias voltages independent of one another.

12. The vertically stacked non-volatile memory device of claim 10, wherein the first string and the second string belong respectively to memory blocks disposed at different layers.

13. The vertically stacked non-volatile memory device of claim 10, wherein the first string and the second string belong respectively to different memory blocks disposed at the same layer.

14. A flash memory card comprising:
   a memory controller configured to program data to a non-volatile memory device, wherein the non-volatile memory device comprises;
      a first string of n memory cell transistors, where "n" is a natural number greater than 2;
      a second string of n memory cell transistors;
      a plurality of n first word lines respectively connected to gates of the first string memory cell transistors;
      a plurality of n second word lines respectively connected to gates of the second string memory cell transistors;
      wherein respective jth ones of the first and second word lines are connected to commonly receive a bias voltage, where "j" ranges from 1 to n;
      a first dummy cell transistor connected at a first end of the first string;
      a second dummy cell transistor connected at a first end of the second string;
      a first dummy word line connected to the gate of the first dummy cell transistor; and
      a second dummy word line connected to the gate of the second dummy cell transistor,
      wherein the first and second dummy word lines are configured to respectively receive different bias voltages independent of one another.

15. The memory card claim 14, wherein the non-volatile memory further comprises:
   a third dummy cell transistor connected to a second end of the first string opposite the first end;
   a fourth dummy cell transistor connected to a second end of the second string opposite the first end;
   a third dummy word line connected to the gate of the third dummy cell transistor; and
   a fourth dummy word line connected to the gate of the fourth dummy cell transistor,
   wherein the third and fourth dummy word lines are configured to respectively receive bias voltages independent of one another.

16. A system comprising:
   a central processing unit configured to control the operation of a memory controller and communicate program data to the memory controller via a system bus, the memory controller being configured to program the program data to a non-volatile memory device, the non-volatile memory device comprising:
      a first string of n memory cell transistors, where "n" is a natural number greater than 2;
      a second string of n memory cell transistors;
      a plurality of n first word lines respectively connected to gates of the first string memory cell transistors;
      a plurality of n second word lines respectively connected to gates of the second string memory cell transistors;
      wherein respective jth ones of the first and second word lines are connected to commonly receive a bias voltage, where "j" ranges from 1 to n;
      a first dummy cell transistor connected at a first end of the first string;
      a second dummy cell transistor connected at a first end of the second string;
      a first dummy word line connected to the gate of the first dummy cell transistor; and
      a second dummy word line connected to the gate of the second dummy cell transistor,
      wherein the first and second dummy word lines are configured to respectively receive different bias voltages independent of one another.

17. A method of operating a non-volatile memory device comprising first and second strings, each string comprising a dummy cell transistor and a plurality of n memory cell transistors, where "n" is a natural number greater than 2, the method comprising:
   independently applying different bias voltages to the dummy cell transistor of the first string and the dummy cell transistor of the second string; and
   respectively applying a same bias voltage to each jth memory cell transistor in the first and second strings, where "j" ranges from 1 to n, using commonly connected word lines receiving the same bias voltage,
   wherein the first string includes a target memory cell transistor corresponding to a target memory cell to be programmed, and before the applying of the different bias voltages and the same bias voltage, the method further comprises:
   reducing a threshold voltage of the dummy cell transistor of the first string and increasing a threshold voltage of the dummy cell transistor of the second string.

18. The method of claim 17, wherein the threshold voltage of the dummy cell transistor of the first string is reduced below 0V, and the threshold voltage of the dummy cell transistor of the second string is increased above 0V.

* * * * *